US008946701B2

(12) United States Patent
Cao et al.

(10) Patent No.: US 8,946,701 B2
(45) Date of Patent: Feb. 3, 2015

(54) THIN FILM TRANSISTOR, ARRAY SUBSTRATE AND DISPLAY DEVICE

(71) Applicant: BOE Technology Group Co., Ltd., Beijing (CN)

(72) Inventors: Zhanfeng Cao, Beijing (CN); Xiaoyang Tong, Beijing (CN); Qi Yao, Beijing (CN); Seongyeol Yoo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 12 days.

(21) Appl. No.: 13/703,551

(22) PCT Filed: Oct. 25, 2012

(86) PCT No.: PCT/CN2012/083500
§ 371 (c)(1),
(2) Date: Dec. 11, 2012

(87) PCT Pub. No.: WO2013/097529
PCT Pub. Date: Jul. 4, 2013

(65) Prior Publication Data
US 2014/0084282 A1    Mar. 27, 2014

(30) Foreign Application Priority Data

Dec. 31, 2011  (CN) ...................... 2011 2 0575315 U

(51) Int. Cl.
| | |
|---|---|
| *H01L 29/12* | (2006.01) |
| *H01L 29/786* | (2006.01) |
| *H01L 29/06* | (2006.01) |
| *H01L 29/51* | (2006.01) |

(52) U.S. Cl.
CPC .......... *H01L 29/7869* (2013.01); *H01L 29/786* (2013.01); *H01L 29/06* (2013.01); *H01L 29/51* (2013.01)
USPC ..................................... 257/43; 257/E29.296

(58) Field of Classification Search
CPC .................................................. H01L 29/7869
USPC ............................................ 257/43, E29.296
See application file for complete search history.

(56) References Cited

U.S. PATENT DOCUMENTS

| | | | |
|---|---|---|---|
| 6,642,071 B2 | 11/2003 | Cheng | |
| 2010/0025675 A1* | 2/2010 | Yamazaki et al. | .............. 257/43 |
| 2010/0220254 A1 | 9/2010 | Liu et al. | |
| 2011/0180802 A1* | 7/2011 | Morosawa et al. | ............. 257/59 |

FOREIGN PATENT DOCUMENTS

| | | |
|---|---|---|
| CN | 101625977 A | 1/2010 |
| CN | 101819363 A | 9/2010 |
| CN | 202423298 A | 9/2012 |

OTHER PUBLICATIONS

International Preliminary Report on Patentability dated Jul. 1, 2014; PCT/CN2012/083500.
International Search Report mailed Jan. 24, 2013; PCT/CN2012/083500.

* cited by examiner

*Primary Examiner* — Matthew W Such
*Assistant Examiner* — Scott Stowe
(74) *Attorney, Agent, or Firm* — Ladas & Parry LLP

(57) ABSTRACT

Embodiments of the present invention provide a thin film transistor, an array substrate and a display device. The thin film transistor comprises a gate layer, a first insulating layer, an active layer, an etch stop layer and a source/drain electrode layer, wherein the active layer is made of a metal oxide material, the first insulating layer, the active layer, the etch stop layer and the source/drain electrode layer are sequentially stacked from bottom to top, the source/drain electrode layer contains an interval separating a source electrode and a drain electrode therein, the etch stop layer is located below the interval, and the etch stop layer has a width greater than that of the interval, and the first insulating layer comprises a laminate of a first sub-insulation layer and a second sub-insulation layer, the second sub-insulation layer is in contact with the active layer and made of an oxygen-rich insulating material.

16 Claims, 3 Drawing Sheets

THIN FILM TRANSISTOR, ARRAY SUBSTRATE AND DISPLAY DEVICE

FIELD OF THE INVENTION

The present invention relates to a thin film transistor (TFT), an array substrate comprising the same and a display device.

BACKGROUND

In the prior art, displays generally comprise cathode ray tube (CRT) displays and liquid crystal displays (LCDs). With the development of science and technology, organic light-emitting diode (OLED) displays gradually come into the people's daily lives.

Currently, CRT displays have been gradually replaced by the liquid crystal displays and OLED displays with a high cost performance. In an imaging process, each liquid crystal pixel in a liquid crystal display is driven by a thin film transistor (TFT) integrated in a thin film transistor substrate and cooperates with a peripheral drive circuit to achieve an image display. In an Active Matrix Organic Light Emission Display (AMOLED), an OLED pixel in an OLED panel is driven by a corresponding TFT in a TFT substrate and cooperates with a peripheral drive circuit to achieve an image display. In the above display, as a switch for controlling the light emitting, the TFT is the key to achieve a liquid crystal display and an OLED display with large size, which is directly related to the development direction of high-performance flat panel displays.

The TFT is usually made of a semiconductor material, and can be classified into the following types according to its semiconductor material for preparing the active layer: inorganic TFT, organic TFT, and inorganic/organic composite type TFT. Currently, the mostly used type is inorganic TFT using silicon based material, compounds, metal oxides and other materials. In the existing flat panel display manufacturing technology, the TFT which has been used in industrialization mainly employs materials such as amorphous silicon, polycrystalline silicon, mono-crystalline silicon and other silicon-based materials. Array substrate used in manufacturing flat panel display mostly uses the amorphous silicon TFT. However, with the increasing size of flat panel displays and the increasing frequency of the driving circuit, the mobility of the TFT is required to be sufficiently high. This is because if the TFT can be made smaller, the resolution of the flat panel display can be greater, and the display effect can be better due to the higher mobility. However, the existing amorphous silicon TFT has a limited carrier mobility, which leads to a longer charging time. Although the existing amorphous silicon TFT can be satisfying in small-size flat panel display, but it is difficult to meet higher display quality and driving requirements in the large-size flat panel display. Therefore, researchers have pay attention to the metal oxide materials which can endow the TFT with higher carrier mobility.

In the case of preparing an active layer of a TFT using the metal oxide material, the supply of the carrier is increased due to lack of oxygen in the metal oxide semiconductor. Therefore, the metal oxide semiconductor has a high carrier density, such that the TFT made of metal oxide has advantages of high carrier mobility. Thus, the TFT can be made smaller, which enables a higher resolution and a better display effect of the flat panel display; simultaneously, the TFT made of the metal oxide have advantages such as few uneven characteristic phenomenon, decreasing cost of materials and processes, lower process temperature, coating process being available, higher transmittance, and higher band gap.

In the prior art, the structure of a metal oxide TFT mainly comprises three types of etch stop type, back channel etch type and coplanar type. These three types of metal oxide TFT generally includes a gate layer, a gate insulating layer, an active layer, a source/drain electrode layer, a passivation layer, and a transparent electrode layer. Currently, the commonly used is the etch stop type metal oxide TFT, and the mostly used metal oxide for preparing the active layer in the etch stop type metal oxide TFT is IGZO (In—Ga—Zn—O). As the etch stop type metal oxide TFT is also formed with an etch stop layer above the active layer so as to prevent the metal oxide IGZO of the active layer from being damaged during the formation of source and drain electrodes, thereby improving the performance and stability of the metal oxide TFT. However, since the metal oxides are poor in stability in the air and is sensitive to oxygen and water vapor, and the oxygen and water vapor can still pass through the etch stop layer so as to deteriorate the performance of the metal oxide in the actual use, the performance of the metal oxide TFT with the active layer formed of metal oxide is decreased, resulting in decreased performance of the metal oxide TFT array substrate and affecting the display quality of a flat panel display.

Currently, the etch stop type metal oxide TFT is usually manufactured by employing a 6-mask patterning process, i.e. using the etch stop layer, in order to prevent the active layer made of the metal oxide from being damaged when the source/drain electrodes are etched. In the metal oxide TFT in the prior art, the gate insulating layer below the active layer is a single layer and prepared by using a SiNx material, and the etch stop layer over the active layer is also a single layer and prepared by using a SiOx material. The difference in etching rate of the SiNx material and the SiOx material under the same condition is relatively high, for example, assuming that the etching rate of SiOx is 1, the etching rate for the SiNx may reach 10 or more. Therefore, in the actual production process, the gate insulating layer not being covered by the active layer pattern is exposed after etching process on the SiOx layer in the etch stop layer is completed. In addition, in the normal preparation process, the uniformity among the layers will be considered, and the etch stop layer is then etched for a more period of time, i.e. the time for over etching. For example, if the etch process on the etch stop layer with a 500 Å thickness needs 50 s to be completed, generally, it will spend 30% of the time (15 s) for over etching. In the over etching process, the gate insulating layer will be inevitably etched to a relatively high extent, so that the over etching has a relatively high impact on the gate insulating layer and the reject ratio of the metal oxide TFT will be increased.

In summary, how to improve the stability of the metal oxide to obtain a metal oxide TFT with high stability, and to improve the stability of the metal oxide TFT array substrate and the display quality of a flat panel display are the current problems to be solved.

SUMMARY

An embodiment of the present invention provides a thin film transistor comprising: a gate layer, a first insulating layer, an active layer, an etch stop layer and a source/drain electrode layer, wherein the active layer is made of a metal oxide material, the first insulating layer, the active layer, the etch stop layer and the source/drain electrode layer are sequentially stacked from bottom to top, the source/drain electrode layer contains an interval separating a source electrode and a drain electrode, the etch stop layer is located below the interval, and the etch stop layer has a width greater than that of the interval, and the first insulating layer comprises a laminate of a first sub-insulation layer and a second sub-insulation insulating layer, the second sub-insulation layer is in contact with the active layer and made of an oxygen-rich insulating material.

Another embodiment of the present invention provides an array substrate, comprising: a substrate; a thin film transistor formed on the substrate, wherein the thin film transistor adopts the thin film transistor according to any embodiment of the present invention, wherein the first insulating layer has an extending portion extending to the outside of a region of the thin film transistor, and the array substrate further comprises a pixel electrode formed over the extending portion of the first insulating layer.

A further embodiment of the present invention provides a display device comprising an array substrate according to any embodiment of the present invention.

BRIEF DESCRIPTION OF THE DRAWINGS

To illustrate technical solutions in embodiments of the present invention more clearly, accompanied drawings of the embodiments will be briefly introduced below. Obviously, the accompanied drawings described below merely relate to some embodiments of the present invention, and are not limitation on the present invention.

DETAILED DESCRIPTION

In order to make objects, technical details and advantages of the embodiments of the invention apparent, hereinafter, technical solutions in embodiments of the present invention will be clearly and fully described in combination with the accompanied drawings in the embodiments of the present invention. Apparently, the embodiments to be described are merely a part but not all of embodiments of the present invention. Every other embodiment as would be obvious to those ordinarily skilled in the art on the basis of described embodiments in the present invention without creative work, comes within the protection scope of the present invention.

An embodiment of the present invention provides a thin film transistor (TFT), comprising: a gate layer, a first insulating layer, an active layer, an etch stop layer and a source/drain electrode layer. The active layer is made of a metal oxide material. The first insulating layer, the active layer, the etch stop layer and the source/drain electrode layer are sequentially stacked from bottom to top. The source/drain electrode layer contains an interval separating a source electrode and a drain electrode, the etch stop layer is located below the interval, and the width of the etch stop layer is greater than that of the interval. The first insulating layer comprises a laminate of a first sub-insulation layer and a second sub-insulation layer, the second sub-insulation layer is in contact with the active layer and made of an oxygen-rich insulating material.

First Embodiment

Figure 1:
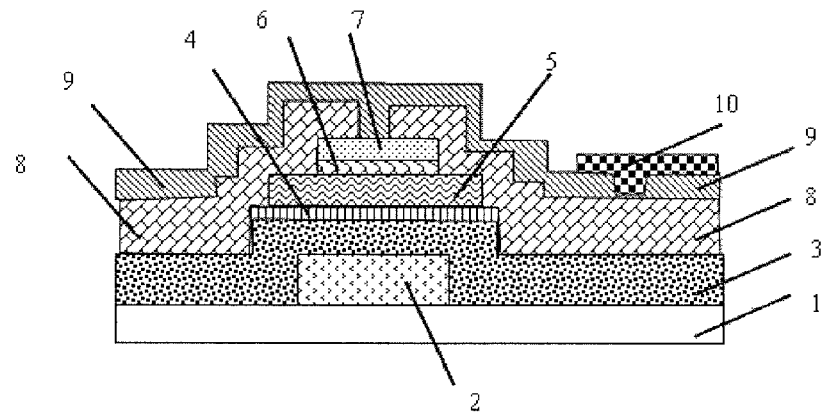
FIG. 1 is a structure diagram of a TFT according to a first embodiment of the present invention.

As shown in FIG. 1, the TFT comprises a gate electrode layer 2, a gate insulating layer (i.e. the gate protection layer) (3 and 4), an active layer 5, an etch stop layer (6 and 7) and a source/drain electrode layer 8 sequentially stacked on a substrate 1.

The active layer 5 is made of a metal oxide semiconductor material. In the present embodiment, both the gate insulating layer and the etch stop layer directly adjacent to the active layer are made of a laminated structure. The gate insulating layer comprises two layers, i.e., the first gate insulating layer 3 and the second gate insulating layer 4, respectively, and the second gate insulating layer 4 is in contact with the active layer 5. The etch stop layer comprises two layers, i.e., the first etch stop layer 6 and the second etch stop layer 7, respectively, and the first etch stop layer 6 is in contact with the active layer 5.

The second gate insulating layer 4 is made of an oxygen-rich insulating material, and the first gate insulating layer 3 is made of an insulating layer which is easy to be etched. The first etch stop layer 6 is made of an oxygen-rich material, and the second etch stop layer 7 is made of an insulating layer which is easy to be etched. That is, the first gate insulating layer 3 and the second gate insulating layer 4 are formed of materials with different etching rates, and the etching rate of the second gate insulating layer 4 is smaller. The first etch stop layer 6 and the second etch stop layer 7 are formed of materials with different etching rates, and the etching rate of the first etch stop layer 6 is smaller.

Below and above the active layer 5, the second gate insulating layer 4 and the first etch stop layer 6 are in direct contact with the active layer 5, respectively. The second gate insulating layer 4 and the first etch stop layer 6 may be made of one selected from a group consisting of $SiO_x$, $Al_2O_3$, $SiN_xO_y$, and $ZrO_2$, the first gate insulating layer 3 and the second etch stop layer 7 may be made of one selected from a group consisting of $SiN_x$, resin and SiC.

In one embodiment, the active layer 5 is made of a metal oxide material of IGZO; the first gate insulating layer 3 is made of $SiN_x$, the second gate insulating layer 4 is made of $SiO_x$, the first etch stop layer 6 is made of $SiO_x$, and the second etch stop layer 7 is made of $SiN_x$. In the present embodiment, the active layer 5 is made of the IGZO material, and both the second gate insulating layer 4 and the first etch stop layer 6 adjacent to the active layer 5 are made of $SiO_x$. Therefore, the material in contact with the active layer 5 is the $SiO_x$ material as the oxygen-rich material. However, in the prior art, the gate insulating layer and the etch stop layer respectively in contact with the active layer are made of $SiN_x$, and the $SiN_x$ has a higher hydrogen content therein due to the use of large flow of $SiH_4$ during the $SiN_x$ deposition, with an amount of hydrogen about 4-6 times higher than that in the $SiO_x$. Therefore, the $SiN_x$ in the prior art is replaced by $SiO_x$, which can prevent the hydrogen atoms in the $SiN_x$ material from diffusing into the metal oxide IGZO material of the active layer, and can effectively prevent the diffusion of oxygen atoms in IGZO of the active layer 5, thereby ensuring the stability of the IGZO material of the active layer, avoiding the variation of the TFT characteristics caused by the diffusion of the oxygen atoms in the active layer 5, and ensuring the stability of the metal oxide TFT.

During the manufacturing procedure, the etching rate of the $SiN_x$ is much higher than that of the etching rate of the $SiO_x$ under the same condition, thereby the first gate insulating layer 3 can be made to have a thickness greater than that of the second gate insulating layer 4, and the thickness of the etch stop layer 7 greater than that of the first etch stop layer 6, in order to improve the production efficiency.

In one embodiment, the first gate insulating layer 3 has a thickness of 2000-5000 Å, and the second gate insulating layer 4 has a thickness of 200-500 Å; the first etch stop layer 6 has a thickness of 200-400 Å, and the second etch stop layer 7 has a thickness of 200-500 Å.

In the present embodiment, both the gate insulating layer and the etch stop layer adjacent to the active layer 5 are made of a laminated structure, and the second gate insulating layer 4 (made of SiOx) and the first etch stop layer 6 (made of SiOx) are directly adjacent to the active layer 5, respectively. In the manufacturing process of the TFT, the etch stop layer will be over etched in the etching process. Since the etching rate of the SiOx is much less than that of the SiNx material under the same condition, the SiNx in the second etch stop layer 7 can be over etched quickly, and the SiOx in the first etch stop layer 6 can have a good buffering effect. During over etching the SiOx in the first etch stop layer 6, the second gate insulating layer 4 not covered by the active layer 5 will be inevitably over etched simultaneously. Based on experience, the function of the etching rate may be more obvious with respect to that of the etching time during the etching process. Since the etching rate of the first etch stop layer 6 is equal to that of the second gate insulating layer 4, the second gate insulating layer 4 can be designed to have a thickness larger than that of the first etch stop layer 6, thus ensuring that the second gate insulating layer 4 will not be completely etched when the over etching on the first etch barrier layer 6 is completed. In this case, the first gate insulating layer 3 will not to be etched, or only etched by a very small part. It can be seen that the portions of the first etch stop layer 6 and the second etch stop layer 7 in the etch stop layer which need to be etched can be ensured to be etched away during the over etching process. After the TFT is manufactured, a passivation layer and a pixel electrode are formed thereon, so as to make a TFT array substrate.

Figure 3:
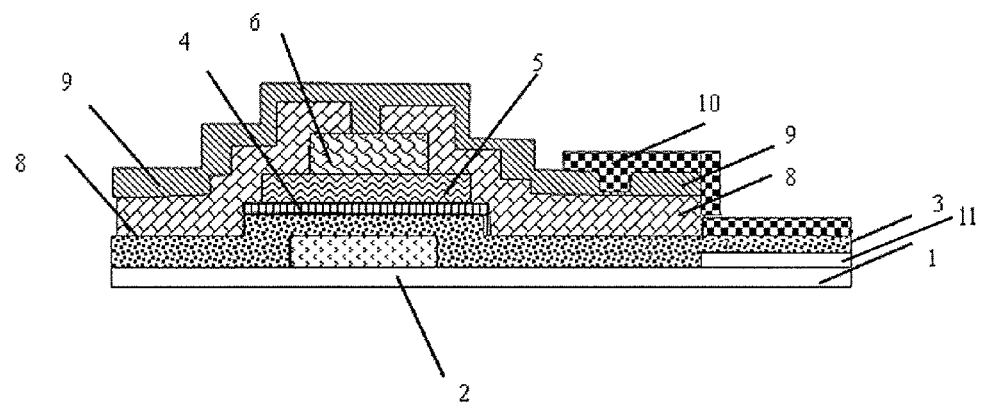
FIG. 3 is a structure diagram of an array substrate according to the second embodiment of the present invention.
Figure 4:
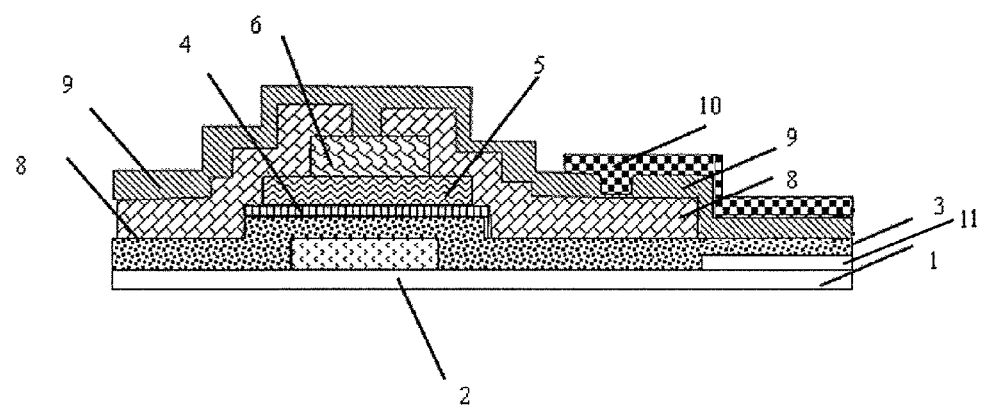
FIG. 4 is a structure diagram of an array substrate according to the second embodiment of the present invention.

In the case that both a pixel electrode and a common electrode are formed on the TFT array substrate, for example, the common electrode can be disposed at the same layer with the gate electrode layer (e.g., see the common electrode 11 in FIG. 3 and FIG. 4). In the resultant array substrate, there is only the first gate insulating layer 3 and the passivation layer 9 between the pixel electrode and the common electrode, or there is only the first gate insulating layer 3 therebetween (i.e., the passivation layer 9 may not be provided in the outside of the TFT), so that the pixel electrode or the passivation layer is in direct contact with the first gate insulating layer 3. In manufacturing the TFT array substrate according to the present embodiment, it is possible to ensure the gate insulating layer to be etched as little as possible, i.e. the over etching has very little influence on the gate insulating layer, which improves the yield of the metal oxide TFT and ensures the process quality of the metal oxide TFT. Because the common electrode is usually disposed in the same layer with the gate electrode, in this case, the distance between the pixel electrode and the common electrode is reduced, thereby increasing a storage capacitance and reducing flashes on the display screen.

The width of the etch stop layer can be designed according to the width of the interval between the source/drain electrodes. Generally, the etch stop layer at least needs to be greater than the width of the above interval, in order to protect the active layer in etching the source and drain electrode patterns. Under the above-described design rules, the width of the etch stop layer will need to be designed to be as small as possible, thus the contact area between the active layer 5 and the source and drain electrodes being increased. The width of the active layer is designed according to the width of the etch stop layer and the above mentioned interval. In the present embodiment, the width of the active layer 5 can have a width ranging from 14 μm to 18 μm, the etch stop layer can have a width ranging from 8 μm to 10 μm. The above mentioned widths are both smaller than the existing widths, so that the overlapping area between the source/drain electrodes and the gate electrode will be reduced. Parasitic capacitance will consume some voltage after the TFT is charged, resulting in not sufficient TFT driving voltage, which eventually leads to bad displaying of the flat panel displays. According to the capacitance formula, the smaller the area, the smaller the capacitance. Therefore the widths being designed to be smaller can reduce the parasitic capacitance between the source/drain electrodes and the gate electrode.

In this embodiment, the manufacturing steps for a TFT array substrate may comprises the follows: preparing a gate electrode layer and forming a pattern of a gate electrode layer according to an existing process; then, performing deposition to form a first gate insulating layer 3 in a deposition apparatus, and then performing low temperature deposition in the same deposition apparatus to form a second gate insulating layer 4, etching gases corresponding to the formed second gate insulating layer comprising $SF_6$, $CF_4$, $O_2$ or $Cl_2$, and forming a pattern of a gate insulating layer; then depositing an active layer 5 by using a metal oxide IGZO and forming a pattern of the active layer; then performing deposition to form a first etch stop layer 6 on the active layer 5 in a deposition apparatus, and then continuously depositing a second etch stop layer 7 in the same deposition apparatus, then forming a pattern of the etch stop layer after an exposure process in an exposure apparatus and an etching process; and then forming a source/drain electrode layer 8 by an existing process, finally forming a passivation layer 9 and preparing a transparent electrode layer 10.

In the present embodiment, the laminated structures of the gate insulating layer and the etch stop layer can be continuously deposited in the same deposition apparatus, and no additional process steps will be added. For example, the first gate insulating layer and the second gate insulating layer can be formed by using high-temperature deposition, and the deposition temperature may be 350-400° C.; the first etch stop layer and the second etch stop layer may be formed by using low-temperature deposition, and the deposition temperature may be 150-200° C. The gate insulating layer is deposited prior to the deposition of the metal oxide semiconductor, thus the high-temperature deposition can be employed. The etch stop layer is deposited after the deposition of metal oxide semiconductor, if the high-temperature deposition is still used, the semiconductor layer may be damaged and the TFT characteristics may be influenced. Here, the etch stop layer is deposited by using the low-temperature deposition, which can prevent the deposition process from damaging the metal oxide semiconductor.

Moreover, with respect to the first etch stop layer and the second etch stop layer, continuously etch can be performed in the same dry etching apparatus. The etching gas may employ $SF_6$, $CF_4$, $O_2$ or $Cl_2$. During using these gases, suitable gas contents can be selected according to process conditions to obtain a suitable etching rate.

Second Embodiment

Figure 2:
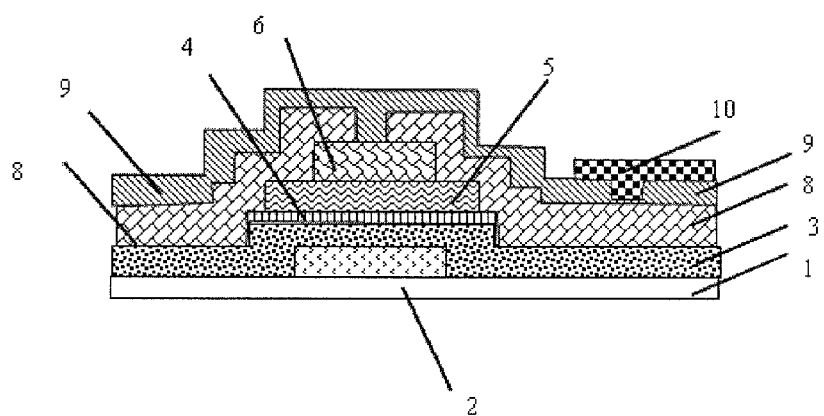
FIG. 2 is a structure diagram of a TFT according to a second embodiment of the present invention.

As shown in FIG. 2, the TFT of the present embodiment is different from that in the first embodiment in that, the etch stop layer in the TFT only adopts a single layer, i.e., the first etch stop layer 6.

The first gate insulating layer 3 is made of SiNx, the second gate insulating layer 4 is made of SiOx, the second gate insulating layer 4 is in contact with the active layer 5; the first etch stop layer 6 is made of SiOx, the SiOx layer has a thickness of 400-1000 Å, the first etch stop layer 6 is in contact with the active layer 5.

Other structures as well as manufacturing method of the TFT in the present embodiment are the same as those in the first embodiment, so the repeated content is omitted here.

An array substrate comprising the TFT in the embodiment has a resultant structure as shown in FIG. 3 or FIG. 4. FIG. 3 shows an example with a second gate insulating layer 4 and a passivation layer 9 between a pixel electrode 10 and a common electrode 11. FIG. 4 shows an example with only the second gate insulating layer 4 between the pixel electrode 10 and the common electrode 11. It should be noted that the TFT array substrate shown in FIG. 3 and FIG. 4 may also employ the TFT structures provided by other embodiments of the present invention. For example, the TFT structure in FIGS. 3 and 4 can be replaced by the TFT structures shown in FIG. 1, 2 or 5. Further, the position of the pixel electrode 10 and 11 of the TFT array substrate according to the embodiment of the present invention is not limited to the cases as shown in FIG. 3 and FIG. 4. Further, in some cases (for example, in a liquid crystal display of vertical electric field mode), the array substrate may not comprise the common electrode thereon.

Third Embodiment

The TFT according to the present embodiment is different from that according to the first embodiment in that, the gate insulating layer in the TFT adopts a laminated structure of a plurality of sub-layers.

The gate insulating layer comprises a first gate insulating layer 3 and a second gate insulating layer 4, the first gate insulating layer 3 and the second gate insulating layer 4 comprises two sequential superposed layers, respectively, i.e. the gate insulating layer comprises two sub-layers, i.e. a lower sub-layer and an upper sub-layer, wherein the lower sub-layer is formed by high-speed deposition, while the upper sub-layer is formed by low-speed deposition; the second gate insulating layer comprises two sub-layers, i.e. a lower sub-layer and an upper sub-layer, wherein the lower sub-layer is formed by high-speed deposition, while the upper sub-layer is formed by low-speed deposition.

Thus, in the manufacturing process of the TFT, the lower sub-layer by the high-speed deposition have a faster deposition speed so as to save time; while the upper sub-layer by the low-speed deposition has a better deposition quality so as to be easier to meet the process requirements and improve the TFT characteristics.

Other structures as well as manufacturing method of the TFT in the present embodiment are the same as those in the first embodiment, so the repeated content is omitted here.

Fourth Embodiment

Figure 5:
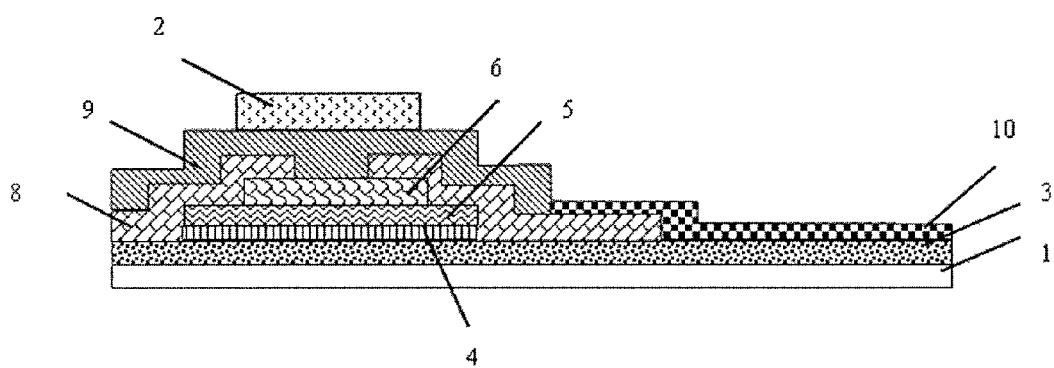
FIG. 5 is a structure diagram of an array substrate with a TFT having a top gate structure.

In this embodiment, the TFT is different from that in the second embodiment in that, the TFT adopts a top-gate type structure, i.e. the gate electrode layer 2 is provided at the top of the respective layers, as shown in FIG. 5. The schemes according to the embodiment can not only be applied in the bottom-gate type structures as shown in FIG. 1-3, but can also be applied to the top-gate type structure as shown in FIG. 5. In the embodiment shown in FIG. 5, the gate electrode layer 2 is located above the layer 9, in this case, the layer 9 and the etch stop layer 6 serves as a gate insulating layer. In this case, the insulating layers 3 and 4 are not used as the gate insulating layer. However, the insulating layers 3 and 4 below the active layer 5 can still use the same configuration with the gate insulating layer in the above-described first to third embodiments.

Other structures as well as manufacturing method of the TFT in the present embodiment are the same as those in the first embodiment, so the repeated content is omitted here.

In the insulating protection layer and the etch stop layer in the first to fourth embodiments, the layer adjacent to the active layer are made of oxygen-rich material. By using SiOx to replace the SiNx which is conventionally used to prepare the gate insulating layer, the hydrogen atoms in the SiNx can be prevented from diffusing into the metal oxide of the active layer, and the diffusion of oxygen atoms in the metal oxide of the active layer can be prevented. In this case, the stability of the active layer IGZO is ensured, thus making the metal oxide TFT have a high stability while improving the product yield in manufacturing the TFT. Further, the performance of the array substrate using the metal oxide TFT can also be improved, and the display quality of the display device using the array substrate can be improved.

The embodiments of the invention also provide an array substrate, comprising: a substrate and a thin film transistor formed on the substrate, wherein the thin film transistor adopts the thin film transistor according to any embodiment of the present invention. The first gate insulating layer 3 has an extending portion which extends to the outside of the region of the thin film transistor. The array substrate further comprises a pixel electrode 10 formed over the extending portion of the first gate insulating layer 3.

In addition, the pixel electrodes may be in direct contact with the extending portion of the first gate insulating layer 3.

Further, the array substrate according to an embodiment of the invention may also comprise a passivation layer 9 disposed over the thin film transistor and between the pixel electrode 10 and the first gate insulating layer 3, and the passivation layer 9 is in direct contact with the extending portion of the first insulating layer 3.

The term of the first gate insulating layer 3 is used in describing the above mentioned array substrate, however, the TFT as shown in FIG. 5 may also be applied to the TFT array substrate. But, the insulating layer 3 and the insulating layer 4 in FIG. 5 are not used as a gate insulating layer. Therefore, in the TFT array substrate according to the above embodiment, the first gate insulating layer 3 is only an example of "the first sub-insulation layer" in the present invention, while the second gate insulating layer 4 is only an example of "the second sub-insulation layer" in the present invention.

The embodiments of the invention further provide a display device comprising an array substrate, and the array substrate adopts the array substrate according to any embodiment of the present invention. The display device can be a liquid crystal display device, such as a liquid crystal panel, a liquid crystal TV, a mobile phone, a liquid crystal display or the like, which comprises a color filter substrate, and the array substrate according to the above-described embodiment. In addition to the liquid crystal display device, the display device may also be other type of display devices, such as an organic light emitting display, and etc., which does not comprise the color filter substrate, but comprises the array substrate in the above-described embodiments.

What is claimed is:

1. A thin film transistor, comprising: a gate layer, a first insulating layer, an active layer, an etch stop layer and a source/drain electrode layer, wherein
   the active layer is made of a metal oxide material,
   the first insulating layer, the active layer, the etch stop layer and the source/drain electrode layer are sequentially stacked from bottom to top,
   the source/drain electrode layer contains an interval separating a source electrode and a drain electrode therein, the etch stop layer is located below the interval, and the etch stop layer has a width greater than that of the interval, the first insulating layer comprises a laminate of a first sub-insulation layer and a second sub-insulation layer, the second sub-insulation layer is in contact with the active layer, the etch stop layer comprises a laminate of a first etch stop layer and a second etch stop layer, the first etch stop layer is in contact with the active layer, and the second sub-insulation layer is made of SiOx, the first sub-insulation layer is made of SiNx, and the first sub-insulation layer and the second sub-insulation layer are formed by a high temperature deposition method: the first etch stop layer is made of SiOx, the second etch stop layer is made of SiNx, and the first etch stop layer and the second etch stop layer is formed by a low temperature deposition method.

2. The thin film transistor according to claim 1, wherein the gate electrode layer is located below the first insulating layer, and the first insulating layer is used as a gate insulating layer.

3. The thin film transistor according to claim 1, wherein the first sub-insulation layer and the second sub-insulation layer are formed of two different materials having different etching rates, and the etching rate of the second insulating layer fate is smaller than that of the first insulating layer.

4. The thin film transistor according to claim 1, wherein the etch stop layer is made of an oxygen-rich material.

5. The thin film transistor according to claim 1, wherein the first etch stop layer and the second etch stop layer are formed of two different materials having different etching rates, and the etching rate of the first etch stop layer is smaller than that of the second etch stop layer.

6. The thin film transistor according to claim 1, wherein a thickness ratio between the second sub-insulation layer and the first sub-insulation layer is in a range from 1/10 to 3/5.

7. The thin film transistor according to claim 1, wherein a thickness ratio between the first etch stop layer and the second, etch stop layer is in a range from 1/2 to 1/1.

8. The thin film transistor according to claim 1, wherein the first sub-insulation layer has a thickness of 2000-5000 Å, and the second sub-insulation layer has a thickness of 200-500 Å.

9. The thin film transistor according to claim 1, wherein the first etch stop layer has a thickness of 200-400 Å, and the second etch stop layer has a thickness of 200-500 Å.

10. The thin film transistor according to claim 1, wherein the first sub-insulation layer and the second etch stop layer are made of one selected from a group consisting of SiNx, resin and SiC, the second sub-insulating layer and the first etch stop layer is made of one selected from a group consisting of SiOx, $Al_2O_3$, SiNxOy and $ZrO_2$.

11. The thin film transistor according to claim 1, wherein the active layer is made of one selected from a group consisting of IGZO, ZnO, $SnO_2$, $In_2O_3$, and IZO.

12. The thin film transistor according to claim 1, wherein the active layer has a width in a range from 14 to 18 µm, the etch stop layer has a width in a range from 8 to 10 µm.

13. The thin film transistor according to claim 1, wherein portions of the active layer at both sides are not covered by the etch stop layer, and the portions of the active layer not covered by the etch stop layer are in contact with the source/drain electrode layer.

14. An array substrate, comprising:
a substrate;
a thin film transistor formed on the substrate, wherein, the thin film transistor comprising: a gate layer, a first insulating layer, an active layer, an etch stop layer and a source/drain electrode layer, wherein the active layer is made of a metal oxide material, the first insulating layer, the active layer, the etch stop layer and the source/drain electrode layer are sequentially stacked from bottom to top, the source/drain electrode layer contains an interval separating a source electrode and a drain electrode therein, the etch stop layer is located below the interval, and the etch stop layer has a width greater than that of the interval, the first insulating layer comprises a laminate of a first sub-insulation layer and a second sub-insulation layer, the second sub-insulation layer is in contact with the active layer, the etch stop layer comprises a laminate of a first etch stop layer and a second etch stop layer the first etch stop layer is in contact with the active layer, the second sub-insulation layer is made of SiOx, the first sub-insulation layer is made of SiNx, and the first sub-insulation layer and the second sub-insulation layer are formed by a high temperature deposition method; the first etch stop layer is made of SiOx the second etch stop layer is made of SiNx, and the first etch stop layer and the second etch stop layer is formed by a low temperature deposition method, the first insulating layer has an extending portion extending to the outside of a region of the thin film transistor, and the array substrate further comprises a pixel electrode formed over the extending portion of the first insulating layer, the pixel electrode is in direct contact with the extending portion of the first insulating layer.

15. The array substrate according to claim 14, further comprising a passivation layer disposed above the thin film transistor and between the pixel electrode and the first insulating layer, and the passivation layer is in direct contact with the extending portion of the first insulating layer.

16. A thin film transistor, comprising: a gate layer, a first insulating layer, an active layer, an etch stop layer and a source/drain electrode layer, wherein the active layer is made of a metal oxide material, the first insulating layer, the active layer, the etch stop layer and the source/drain electrode layer are sequentially stacked from bottom to top, the source/drain electrode layer contains an interval separating a source electrode and a drain electrode therein, the etch stop layer is located below the interval, and the etch stop layer has a width greater than that of the interval, and the first insulating layer comprises a laminate of a first sub-insulation layer and a second sub-insulation layer, the second sub-insulation layer is in contact with the active layer and made of an oxygen-rich insulating material, the thin film transistor further comprising a second insulating layer disposed above the source/drain electrode layer, wherein the gate layer is disposed above the second insulating layer.

* * * * *